United States Patent [19]

Levy et al.

[11] Patent Number: 5,745,407
[45] Date of Patent: Apr. 28, 1998

[54] TRANSISTORLESS, MULTISTABLE CURRENT-MODE MEMORY CELLS AND MEMORY ARRAYS AND METHODS OF READING AND WRITING TO THE SAME

[75] Inventors: Harold J. Levy, Seal Beach; Thomas C. McGill, Pasadena, both of Calif.

[73] Assignee: California Institute of Technology, Pasadena, Calif.

[21] Appl. No.: 628,821

[22] Filed: Apr. 5, 1996

Related U.S. Application Data

[62] Division of Ser. No. 238,390, May 5, 1994, Pat. No. 5,535,156.

[51] Int. Cl.$^6$ .............................. G11C 11/00; G11C 11/36; H01L 27/108
[52] U.S. Cl. ................ 365/159; 365/174; 365/175; 257/1; 257/200; 257/296
[58] Field of Search ................ 257/1, 200, 296; 365/71, 175, 159, 174

[56] References Cited

U.S. PATENT DOCUMENTS

| | | |
|---|---|---|
| 3,363,240 | 1/1968 | Cola et al. |
| 5,280,445 | 1/1994 | Shieh et al. |
| 5,281,871 | 1/1994 | Mori et al. |
| 5,390,145 | 2/1995 | Nakasha et al. |
| 5,438,539 | 8/1995 | Mori .................................. 365/159 |
| 5,535,156 | 7/1996 | Levy et al. ........................ 365/175 |

FOREIGN PATENT DOCUMENTS 58-153295  12/1993  Japan.

OTHER PUBLICATIONS

"Switching Phenomena in Metal–Insulator–n/p+ Structures: Theory, Experiment and Applications", J.G. Simmons et al., The Radio and Electronic Engineer, vol. 48, No. 5, pp. 215–226, May 1978.

"Optical and Electrical Oscillations in Double–Heterojunction Negative Differential Resistance Devices", S.J. Kovacic et al., IEE Transactions on Electron Devices, vol. 40, No. 6, pp. 1154–1160, Jun. 1993.

(List continued on next page.)

*Primary Examiner*—Valencia Martin Wallace
*Attorney, Agent, or Firm*—Blakely, Sokoloff, Taylor & Zafman LLP

[57] ABSTRACT

A transistorless memory cell for storing information as one of two possible bistable current states comprises (i) at least one first transistorless device exhibiting N-type negative differential resistance, including a high-impedance region, a low-impedance region and a negative-resistance region and having a polarity and (ii) at least one second transistorless device exhibiting an exponential or linear current-voltage characteristic and coupled to the first transistorless device. The read/write operation of the transistorless memory cell is performed in a current mode. A method for fabricating a self-aligned, three-dimensional structure of memory cells comprises the steps of (i) forming a first conducting layer, (ii) forming a first semiconductor layer above the first conducting layer, (iii) forming a second semiconductor layer above the first semiconductor layer, (iv) patterning the second semiconductor layer, (v) etching the second semiconductor layer, the first semiconductor layer and the first conducting layer, (vi) forming a second conducting layer above the second semiconductor layer, (vii) patterning and etching the second conducting layer, and (viii) etching the second semiconductor layer using the second conducting layer as a mask to form multiple semiconducting devices of a second kind, and etching the first semiconductor layer using the second conducting layer as a mask to form multiple semiconducting devices of a first kind, wherein the semiconducting devices of the first kind exhibit N-type negative differential resistance, and the semiconducting devices of the second kind may exhibit exponential or linear current-voltage characteristics.

9 Claims, 15 Drawing Sheets

OTHER PUBLICATIONS

"Characteristics of Three-Terminal Metal-Tunnel Oxide-n/p+ Devices", K.C. Chik et al., Solid-State Electronics, vol. 22, pp. 589-594.

"Current-Mode Techniques for High-Speed VLSI Circuits with Application to Current Sense Amplifier for CMOS SRAM's", E. Seevinck et al., IEEE Journal of Solid-State Circuits, vol. 26, No. 4, pp. 525-536, Apr. 1991.

"High-Speed Sensing Techniques for Ultrahigh-Speed SRAM's", H. Nambu et al., IEEE Journal of Solid-State Circuits, vol. 27, No. 4, pp. 632-640, Apr. 1992.

"A Novel Metal-Insulator Semiconductor Switch", A.A. El Badry, M.A Sc. Thesis, University of Toronto, 1976.

"Switching in New MOS Devices and Applications", K.D. Chik, M.A. Sc. Thesis, University of Toronto, 1977.

| Maximum Transient Current (A/cm²) | Address Current -to- Static Current Ratio | Cell Size (µm) and Density (cm⁻²) | | | |
|---|---|---|---|---|---|
| | | 200µA/1ns | 20µA/10ns | 2µA/100ns | |
| $10^5$ | (20,000) | .45 x .45<br>123 MB | .14 x .14<br>1 GB | .04 x .04<br>15 GB | |
| $10^4$ | (2000) | 1.4 x 1.4<br>12 MB | .45 x .45<br>123 MB | .14 x .14<br>1GB | |
| $10^3$ | (200) | 4.5 x 4.5<br>1 MB | 1.4 x 1.4<br>12 MB | .45 x .45<br>123 MB | |

*Figure 15*

TRANSISTORLESS, MULTISTABLE CURRENT-MODE MEMORY CELLS AND MEMORY ARRAYS AND METHODS OF READING AND WRITING TO THE SAME

This is a Divisional Application of application Ser. No. 08/238,390, filed May 05, 1994 U.S. Pat. No. 5,535,156.

STATEMENT OF GOVERNMENT INTEREST

The U.S. Government has certain rights in this invention pursuant to Contract No. N00014-93-I-0710 awarded by the Office of Naval Research.

BACKGROUND OF THE INVENTION

1. Field of the Invention

The present invention relates to the field of computer memory, and more particularly, to ultra-dense and ultra-fast random access memory with reasonable power consumption.

2. Background of the Invention

Every computer system requires memory for storing data and programs. There are many different types of memory incorporating a variety of technologies and access times. One important type of memory is a read-only memory in which fixed programs and/or data is stored in the memory and only the read operation is allowed. Thus, a read-only memory is usually written only once at the time of manufacturing. A typical function of a read-only memory is to store programs for algorithms used to calculate various arithmetic functions in small calculators. Another more powerful type of memory is a random-access memory (RAM) in which an operator can both read and write to memory cells and be able to access any cell or a group of cells in the memory. A RAM can be either static or dynamic. A static RAM typically utilizes flip-flops, and retains information written thereto as long as power is applied. In a static RAM, each memory cell may require six or more transistors, as shown in the prior art circuit of FIG. 2. Because a static RAM requires multiple transistors in each cell, its chip packaging density is limited. In addition, the power dissipation of a static RAM may be relatively high. However, the big advantage of a static RAM is its high operating speed. A dynamic RAM, on the other hand, can achieve higher chip packaging density and lower cost per memory cell because of its simple memory cell structure, consisting of one transistor and a small capacitor. Although a dynamic RAM is popular because of its high packaging density, the capacitor will lose its charge over a period of time unless subjected to a periodic refresh cycle. Thus, a dynamic memory may execute both read and write operations, but also requires periodic refresh cycles, unlike a static RAM which can retain its information as long as power is applied.

Traditionally, semiconductor RAMs have used transistors including bipolar transistors and metal-oxide-semiconductor (MOS) devices. Bipolar RAMs incorporate bipolar junction transistors and are manufactured using TTL, SCL or $I^2L$ technology. Each memory cell utilizes a flip-flop, and the access time is usually in the 20–100 nsec range. Bipolar transistor RAMs have been used in applications where high operating speeds are required at the expense of the relatively large power dissipation. In order to achieve high density packaging, low power dissipation and low manufacturing cost while maintaining reasonable operating speed, MOS devices have been used in computer memories instead of bipolar transistors. Furthermore, transistor sizes have been decreased in order to achieve higher density integration.

The present invention describes a memory cell which comprises a device exhibiting an exponential or linear current-voltage characteristic in series with a device exhibiting N-type negative differential resistance. Although negative differential resistance devices have been used in RAMs (FIGS. 5 and 6), the present invention departs significantly from the past implementation practices, as will be described in detail below. The present invention achieves high speed operations by incorporating (i) transistorless memory cells based on negative differential resistance devices and (ii) the current-mode nature of information storage which provides the additional advantage of higher tolerance to radiation induced charge fluctuations. In addition, in order to achieve high density packaging and a simpler and more tolerant manufacturing process, the present invention's memory cells are fabricated perpendicular to the lithography plane using a self-aligned fabrication process.

SUMMARY OF THE INVENTION

The present invention provides transistorless memory cells that store information as one of two possible bistable current states. A transistorless memory cell comprises (i) at least one first transistorless device exhibiting N-type negative differential resistance and including a high-impedance region, a low-impedance region and a negative-resistance region and (ii) at least one second transistorless device. The second transistorless device may exhibit an exponential or linear current-voltage characteristic and coupled to the first transistorless device. The read/write operation of the transistorless memory cells is performed in a current mode.

In addition, the present invention provides a method for fabricating a self-aligned, three-dimensional structure of memory cells comprising the steps of (i) forming a first conducting layer, (ii) forming a first semiconductor layer over the first conducting layer, (iii) forming a second semiconductor layer over the first semiconductor layer, (iv) patterning the second semiconductor layer, (v) etching the second semiconductor layer, the first semiconductor layer and the first conducting layer, (vi) forming a second conducting layer over the second semiconductor layer, (vii) patterning and etching the second conducting layer, and (viii) etching the second semiconductor layer using the second conducting layer as a mask to form a plurality of semiconducting devices of a second kind, and etching the first semiconductor layer using the second conducting layer as a mask to form a plurality of semiconducting devices of a first kind, wherein the semiconducting devices of the first kind exhibit N-type negative differential resistance, and the semiconducting devices of the second kind exhibit exponential or linear current-voltage characteristics.

BRIEF DESCRIPTION OF THE DRAWINGS

FIG. 15 presents a speed/density estimation table of memory systems with transistorless memory cells in accordance with the present invention.

DETAILED DESCRIPTION OF THE INVENTION

The present invention provides a new type of computer memory which operates by storing information as one of at least two possible current states in a bistable load-line memory cell. The memory cell comprises a first transistorless device exhibiting negative differential resistance in series with a second transistorless device exhibiting an exponential or linear current-voltage characteristic. While the conventional static random access memories and dynamic random access memories incorporate transistors in memory cells and operate in a voltage-mode, the present invention implements transistorless devices in memory cells and operates in a current-mode to achieve ultra-high density, ultra-high speed and low manufacturing cost.

Figure 1:
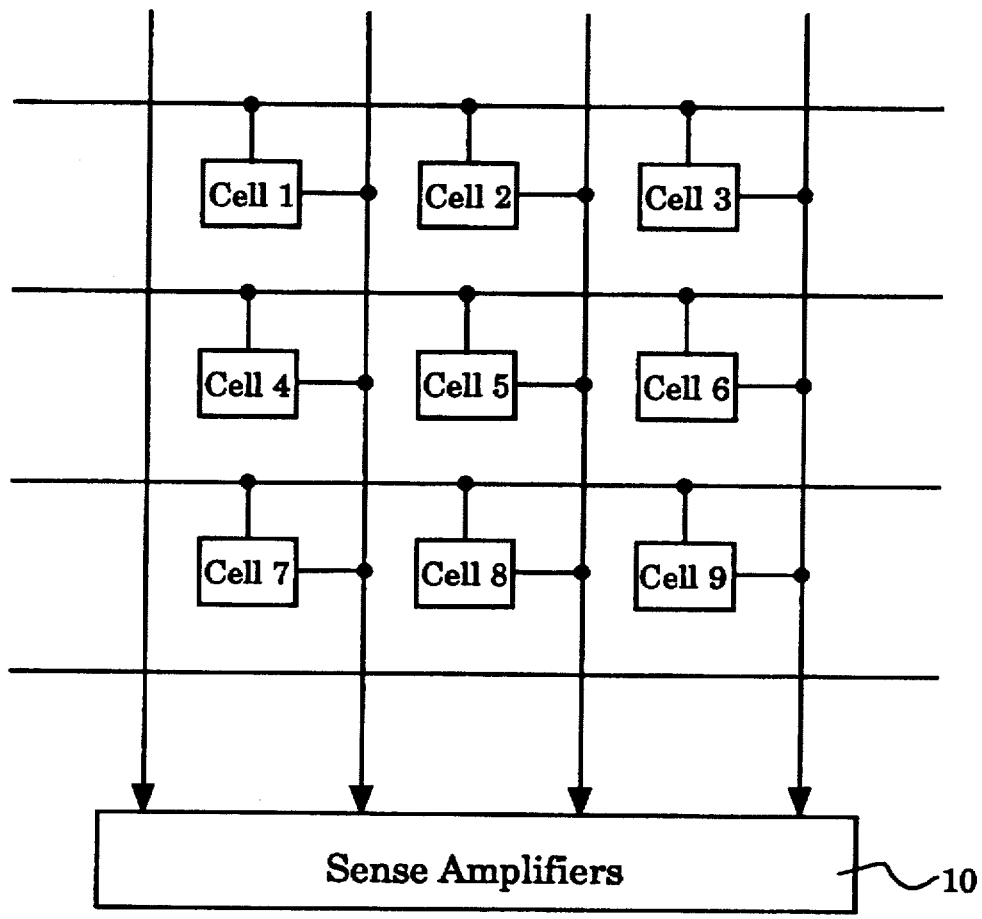
FIG. 1 is a block diagram of a prior art memory system.

Now referring to FIG. 1, a random access memory typically includes a large number of basic units referred to as memory cells. FIG. 1 shows nine cells denoted as cell 1, cell 2, cell 3, cell 4, etc. Each memory cell contains at least one transistor device and exhibits two logic states 1 and 0—high and low voltages—and stores the corresponding charges. Each row is called a word line, and each column is called a bit line. Each memory cell constitutes one bit. Thus, by multiplying the number of word lines by the number of bit lines, one can establish the storage capacity, the total number of bits in a memory. To access an individual memory cell, one needs to provide appropriate voltage signals to the word line and the bit line that are connected to the individual cell. A memory system utilizes either a voltage-mode or a current-mode read/write scheme to read and store information in a memory cell.

Figure 2:
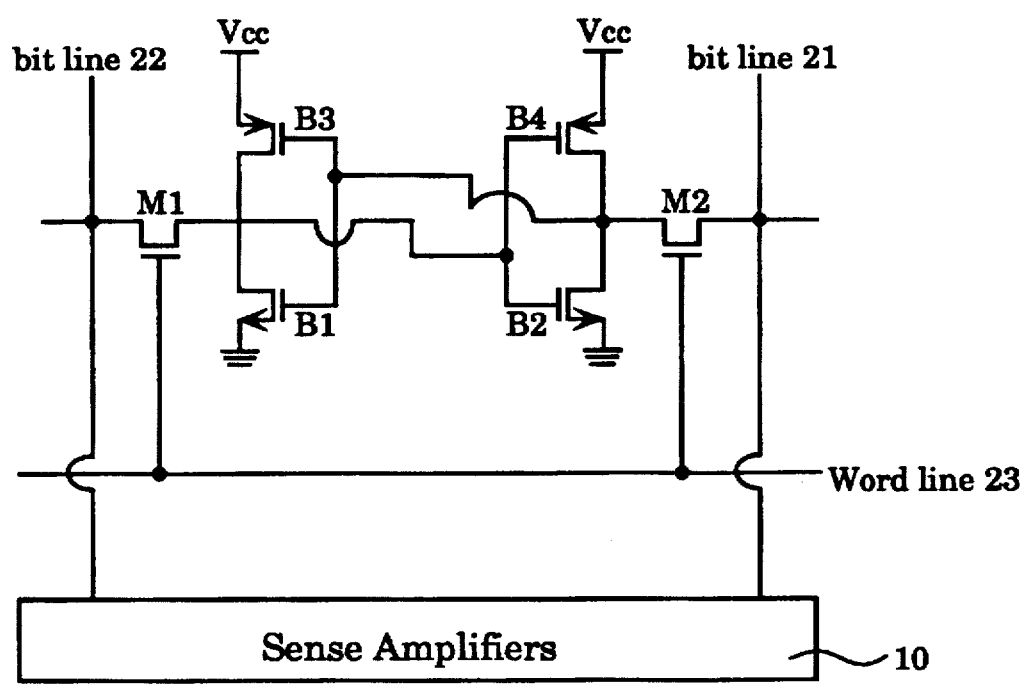
FIG. 2 presents a prior art CMOS circuit static random access memory cell.

FIG. 2 presents a conventional CMOS static random access memory cell that operates in a voltage-mode. The memory cell comprises a flip-flop consisting of four transistors B1, B2, B3 and B4 and two access transistors M1 and M2. When word line 23 is selected, the access transistors M1 and M2 turn on and connect the flip-flop to bit lines 21 and 22. First, a read operation of the memory cell is discussed. If the cell is storing a logic 0, B1 is on, and B2 is off. When word line 23 is selected, M1 and M2 turn on, and current flows from bit line 22 through M1 and B1 to ground. The voltage of bit line 22 is thus lowered to ground. Simultaneously, current flows from Vcc through B4 and M2 to bit line 21. This causes the voltage of bit line 21 to rise toward Vcc. Sense amplifiers 10 coupled to bit lines 21 and 22 detect the relative voltage levels of bit lines 21 and 22 to determine the logic stored in the cell.

In a write operation, the data to be stored and its complement are sent to bit line 22 and bit line 21, respectively. For instance, if a logic 0 is to be stored in the cell, bit line 22 is lowered to ground, and bit line 21 is raised to Vcc. When word line 23 is selected, the gates of transistors B1 and B3 are coupled to the high voltage of bit line 21 through M2, and thus B1 turns on, and B3 turns off. The gates of transistors B2 and B4 are coupled to the low voltage of bit line 22 through M1, and thus B2 turns off while B4 turns on. Since the voltage of bit line 22 is low, M1 is on, B1 is on, and B3 is off, the voltage of the drain of B1 is lowered to ground. The voltage of the drain of B2, on the other hand, is raised toward Vcc because bit line 21 is high, M2 is on, B4 is on, and B2 is off. The logic state, once written, does not change until the next write operation.

Figure 3:
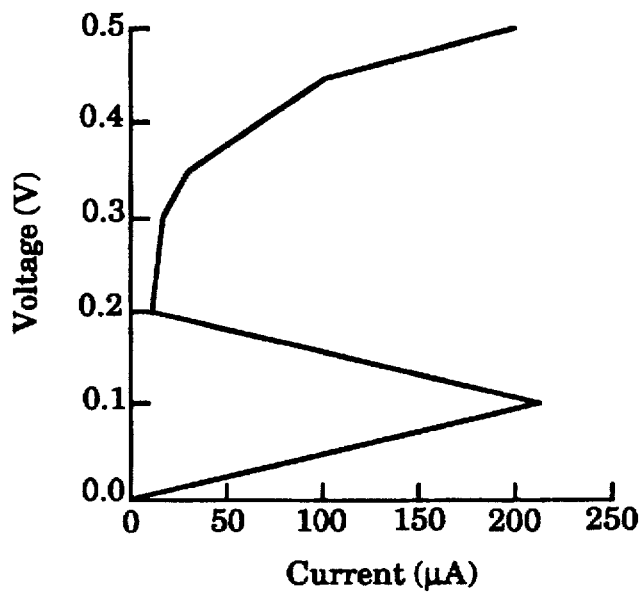
FIG. 3 illustrates a current-voltage characteristic of an S-type negative differential resistance device.

Instead of incorporating conventional MOS or bipolar transistors, the present invention employs in its memory cell a switching device that exhibits negative differential resistance (NDR). Switching devices that show negative differential resistance include but are not limited to resonant-tunneling diodes, metal-insulator-semiconductor switch diodes, unijunction transistors, semiconductor-controlled rectifiers, three-terminal thyristors, diacs, triacs, trigger thyristors and field-controlled thyristors. Negative differential resistance devices can be categorized into two types: an S-type NDR and an N-type NDR. FIG. 3 illustrates the current-voltage characteristic of an S-type NDR. The reason why this type of negative differential resistance devices is called an S-type NDR is the shape of the curve. The current-voltage characteristic shown here is that of a resonant-tunneling diode.

Figure 4:
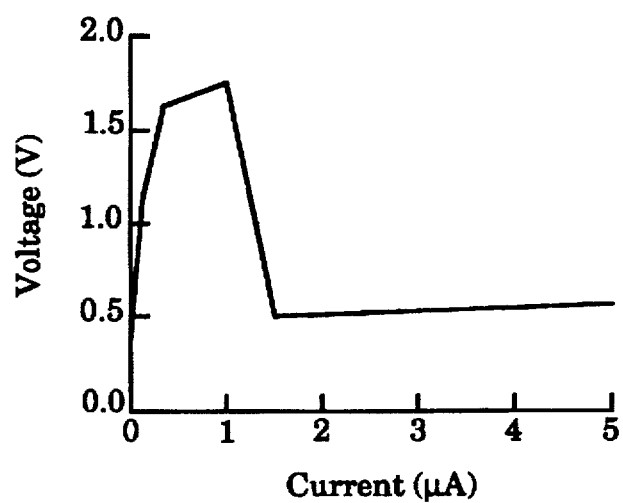
FIG. 4 illustrates a current-voltage characteristic of an N-type negative differential resistance device.

FIG. 4 illustrates the current-voltage characteristic of an N-type negative differential resistance device. Again, the reason for calling such a device an N-type NDR device is the shape of the curve. The current-voltage characteristic shown in FIG. 4 is that of a metal-insulator-semiconductor switch diode. An N-type NDR device can incorporate a current-mode read/write scheme to read and store information.

Figure 5:
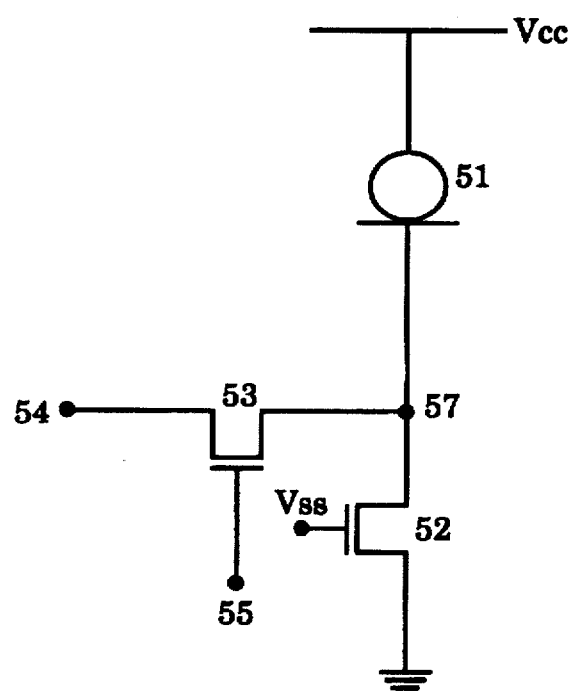
FIG. 5 presents a prior art memory cell comprising a negative differential resistance device, two transistors and five different voltage signal lines.
Figure 7A:
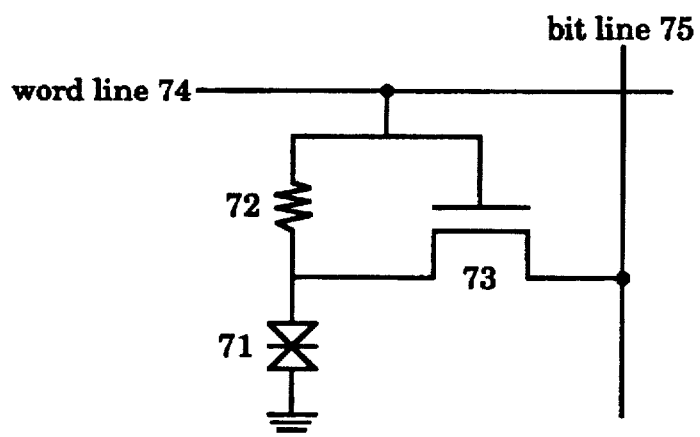
FIG. 7A presents a memory cell comprising an S-type negative differential resistance device, a transistor and a resistor load according to the present invention.
Figure 8A:
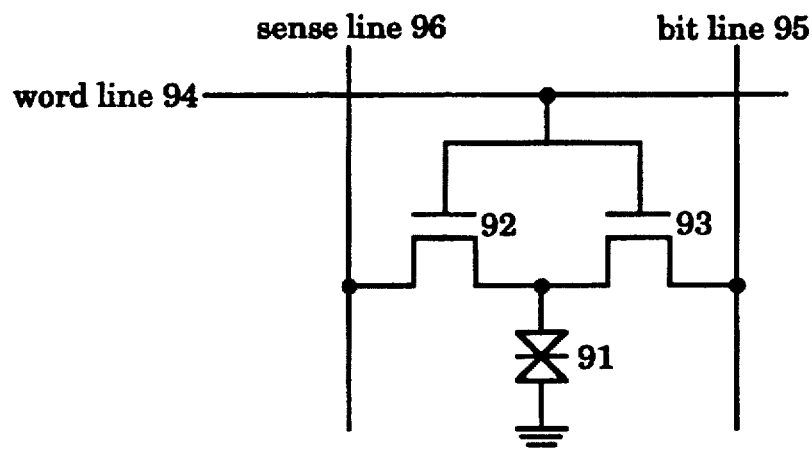
FIG. 8A presents a memory cell comprising an S-type negative differential resistance device and two transistors according to the present invention.
Figure 9A:
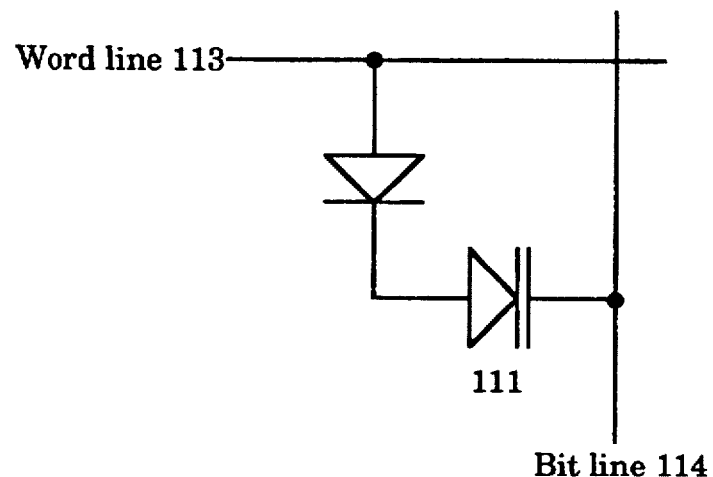
FIG. 9A presents a preferred embodiment of a transistorless memory cell comprising an N-type negative differential resistance device and a diode in accordance with the present invention.
Figure 9B:
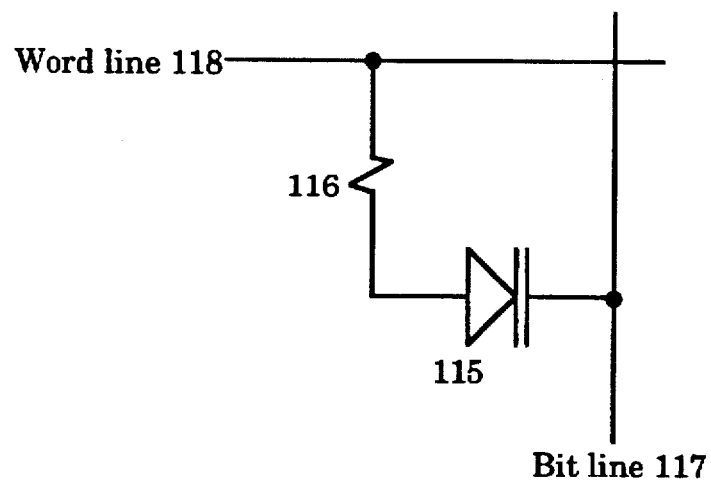
FIG. 9B presents a transistorless memory cell comprising an N-type negative differential resistance device and a resistor in accordance with the present invention.

FIGS. 5, 7A, 8A, 9A and 9B illustrate memory cells that incorporate a NDR device. The memory cell in FIG. 5 is disclosed in "Switching Phenomena in Metal-Insulator-n/p+ Structures: Theory, Experiment and Applications" by Simmons and El-Badry, published in The Radio Electronic Engineer, Vol. 48, No. 5, pp. 223-224, May 1978 and in "A Novel Metal-Insulator Semiconductor Switch" by El-Badry, a thesis submitted to University of Toronto in 1976. FIGS. 7A and 8A present memory cells according to the present invention that show remarkable improvement over the memory cell in FIG. 5. FIG. 9A and 9B present memory cells according to the present invention that are significant departures from the memory cells shown in FIGS. 5, 7A and 8A. The discussions that follow below describe each of the memory cells in detail and distinguish the present invention from the memory cell described in FIG. 5.

FIG. 5 shows a memory cell comprising a NDR device 51, a load transistor 52, a data transistor 53, a data enable line 55, a data line 54, a ground, a power supply $V_{cc}$ and a power supply $V_{ss}$. The memory cell operates in a voltage-mode. To store information in the memory cell, the data enable line 55 must turn on data transistor 53. If the input signal at data line 54 is a logic 1 (high voltage), then node 57 goes high since it is connected to data line 54 through data transistor 53, and NDR device 51 turns off. If the input signal at data line 54 is a logic 0 (low voltage), then data transistor 53 transfers the input signal to node 57, and thus node 57 goes low, and NDR device 51 turns on. To read the logic stored in the memory cell, the data enable line 55 turns on data transistor 53, and the voltage at node 57 is transferred to data line 54 through data transistor 53.

Figure 6:
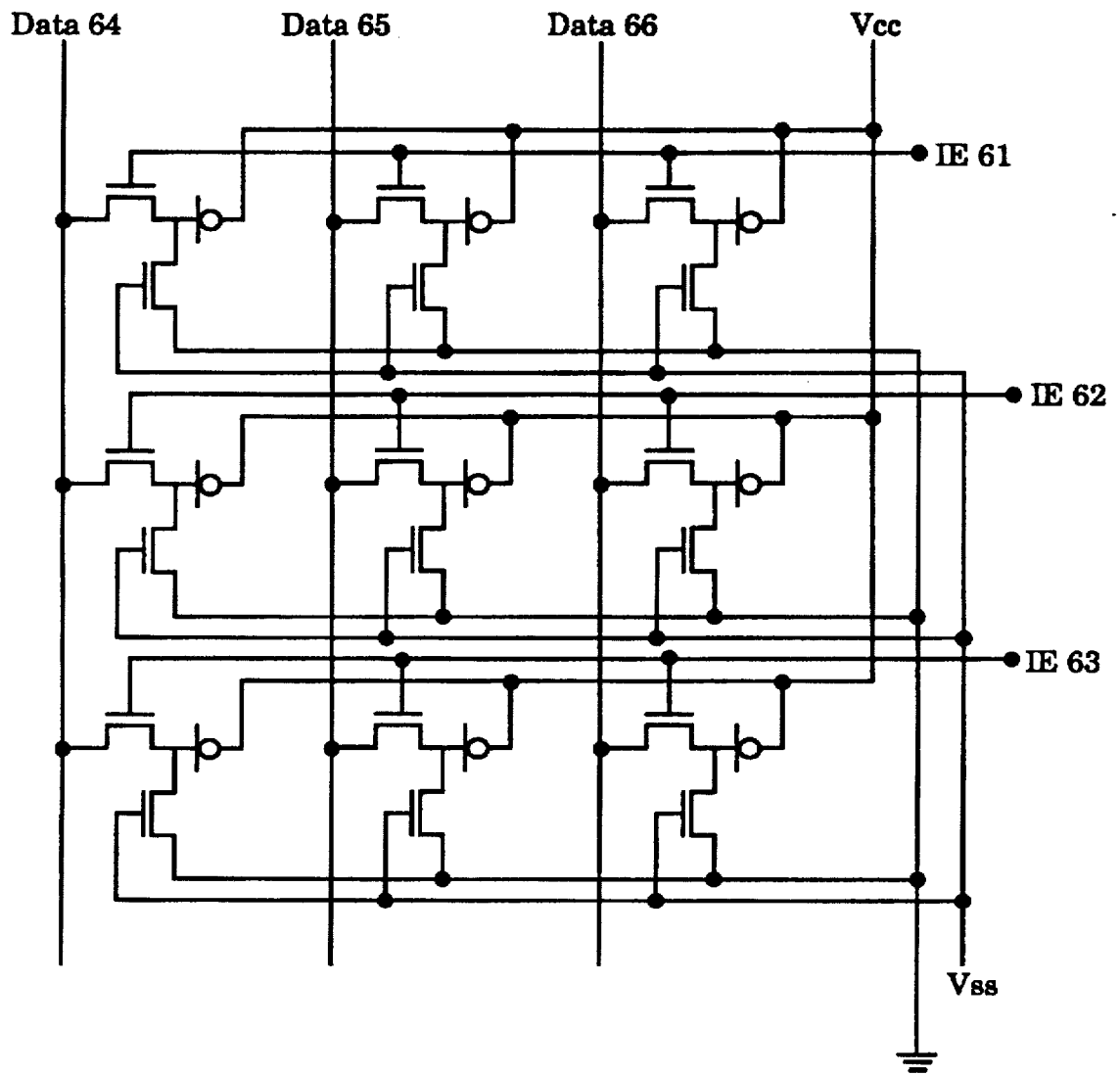
FIG. 6 presents a prior art memory system with a plurality of the memory cells shown in FIG. 5.

FIG. 6 shows a memory system with a plurality of the memory cells of the type shown in FIG. 5. Because the memory cell of FIG. 5 requires five different voltage signal lines—a data line 54, a data enable line 55, a ground, a power supply $V_{cc}$ and a power supply $V_{ss}$, a significant amount of real estate on a chip is occupied by metal lines representing these five different voltage signal lines. Thus, a memory system incorporating the memory cells of FIG. 5 may have to significantly sacrifice chip packaging density.

FIG. 7A shows a S-type NDR memory cell according to the present invention. The memory cell comprises an S-type NDR device 71, a transistor 73, a resistor load 72, a word line 74, a bit line 75 and a ground. S-type NDR device 71 is coupled to ground, resistor 72 and transistor 73. Resistor 72 is coupled to word line 74, and transistor 73 is coupled to bit line 75 and word line 74. To minimize the amount of the quiescent current produced by the memory cell, this S-type NDR memory cell in FIG. 7A operates in a voltage-mode like the memory cell in FIG. 5. However, significant differences exist between the two memory cells. First, the S-type NDR memory cell in FIG. 7A has only one transistor and not two. Second, the S-type NDR memory cell has only three voltage lines and not five, thus increasing chip packaging density. Third, while the memory cell of FIG. 5 requires a direct connection between two power supplies $V_{cc}$ and $V_{ss}$ and the memory cell, the S-type NDR memory cell in FIG. 7A does not require a direct connection to a power supply line.

Figure 7B:
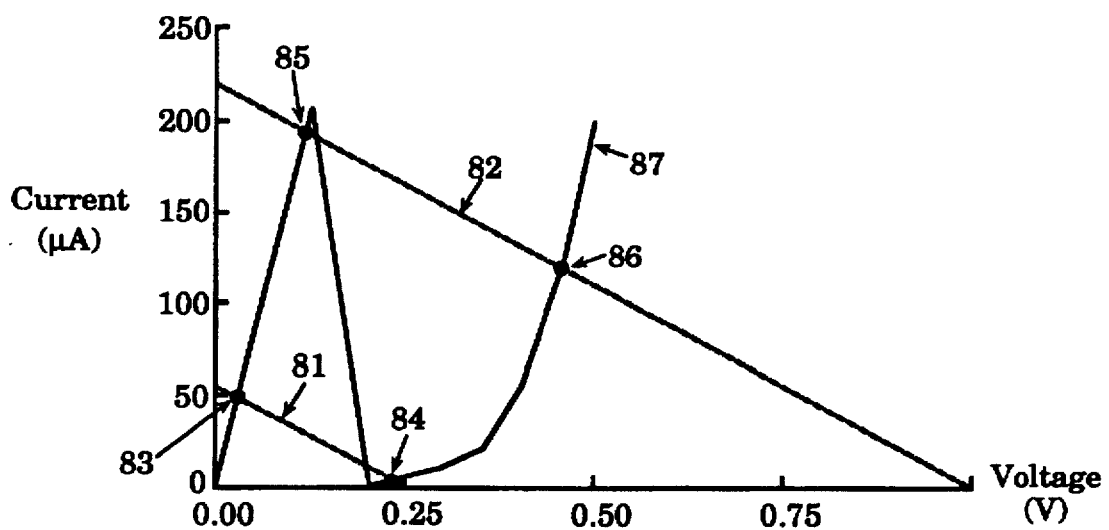
FIG. 7B illustrates the current-voltage characteristics of the memory cell in FIG. 7A.

FIG. 7B illustrates the current-voltage characteristics of the memory cell in FIG. 7A. Curve 87 is the current-voltage characteristic of the S-type NDR device 71. Lines 81 and 82 are the resistor load lines of resistor 72. During a standby period, the voltages applied to word line 74 and bit line 75 are small. Line 81 represents the resistor load line during the standby period. The intersection point 83 and intersection point 84 are two possible operating points during the standby period. Line 82 is the resistor load line during a read mode. Intersection points 85 and 86 indicate the operating points during the read mode. Thus, if the memory cell of FIG. 7A contains a logic 1, during the standby period, the operating point will be at the intersection point 83, and during the read mode, the operating point will be at intersection point 85. If the memory cell contains a logic 0, during the standby period, the operating point is at intersection point 84, and during the read mode, the operating point is at intersection point 86.

FIG. 8A shows another memory cell with an S-type NDR device. The memory cell includes an S-type NDR device 91, two transistors 92 and 93, a word line 94, a bit line 95, a static line 96 and a ground. S-type NDR device 91 is coupled to transistors 92 and 93 and to ground. Transistor 92 is coupled to word line 94 and to sense line 96. Transistor 93 is coupled to bit line 95 and word line 96. Like the memory cell in FIG. 5, the memory cell in FIG. 8A must be operated in a voltage-mode and requires two transistors. However, the memory cell shown in FIG. 8A utilizes the maximum advantage of peak-to-valley current ratio for minimum quiescent current. In addition, because the memory cell in FIG. 8A has four voltage lines instead of five as in FIG. 5, a memory system comprising memory cells of FIG. 8A should have higher chip packaging density than that of FIG. 5. Furthermore, while the memory cell of FIG. 5 requires two power supplies, Vcc and $V_{ss}$, to be directly connected to the memory cell, the memory cell in FIG. 8A does not require a direct connection to a power supply.

Figure 8B:
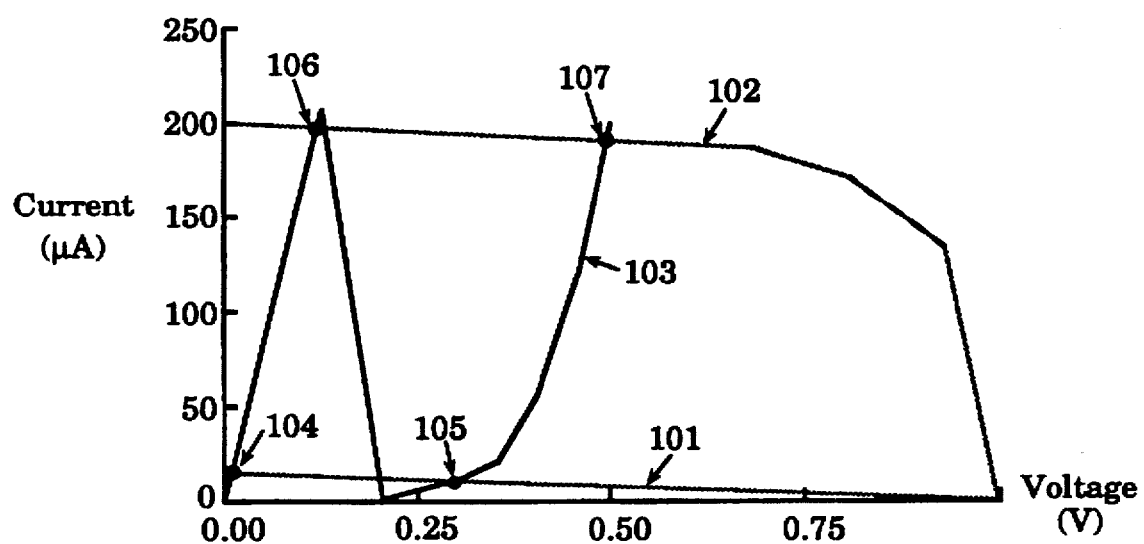
FIG. 8B illustrates the current-voltage characteristics of the memory cell in FIG. 8A.

FIG. 8B illustrates the current-voltage characteristics of the memory cell shown in FIG. 8A. Curve 103 represents the current-voltage characteristic of S-type NDR device 91. Curve 101 represents the transistor load line during a standby period, and curve 102 represents the transistor load line during a read mode. During the standby period, the possible operating points are intersection point 104 and intersection point 105. During the read mode, two possible stable operating points are intersection point 106 and intersection point 107. If the memory cell in FIG. 8A is storing a logic 0, the memory cell would operate at intersection point 105 during the standby period, and at intersection point 107 during the read mode. If the memory cell is storing a logic 1, the operating point during the standby period is intersection point 104, and the operating point during the read mode is intersection point 106.

Referring now to FIG. 9A, a preferred embodiment of the present invention, a transistorless memory cell that operates in a current-mode is shown in accordance with the present invention. The transistorless memory cell comprises an N-type NDR device 111, a diode 112, a word line 113 and a bit line 114. N-type NDR device 111 is coupled to diode 112 and bit line 114. Diode 112 is coupled to word line 113. It should be noted that positions of diode 112 and N-type NDR device 111 may be interchanged so that diode 112 is coupled to bit line 114 while N-type NDR device 111 is coupled to word line 113.

The present invention's memory cell shown in FIG. 9A is distinguishable and superior to the memory cell shown in FIG. 5. First, because the memory cell in FIG. 9A operates in a current-mode instead of a voltage-mode as in FIG. 5, the memory cell can be accessed at a much faster rate. Second, because the memory cell in FIG. 9A is transistorless and only requires two voltage lines instead of five, a memory system comprising memory cells of FIG. 9A can achieve much higher chip packaging density than that of FIG. 5.

Figure 10:
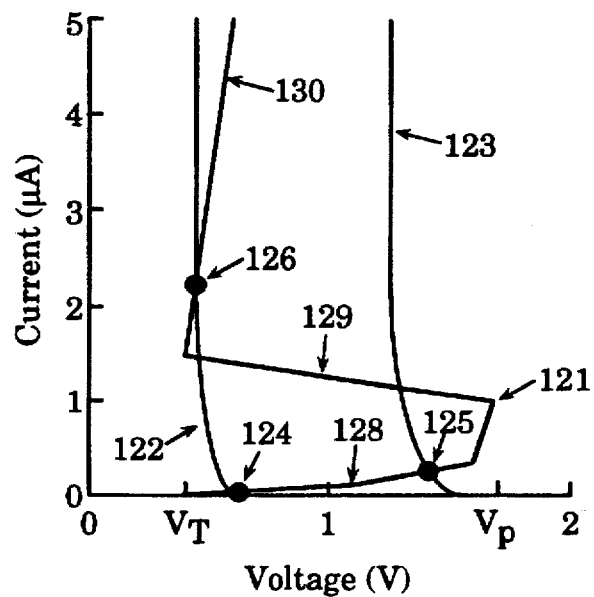
FIG. 10 illustrates the current-voltage characteristics of the memory cell of FIG. 9A in a linear scale.
Figure 11:
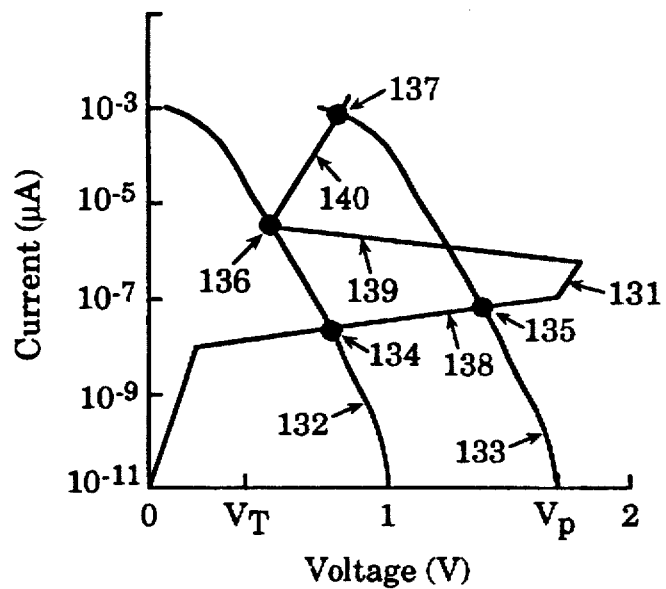
FIG. 11 illustrates the current-voltage characteristics of the memory cell of FIG. 9A in a logarithmic scale.

FIG. 10 presents the current-voltage characteristics of the memory cell shown in FIG. 9A in a linear scale, and FIG. 11 shows the same current-voltage characteristics in a logarithmic scale. Referring to FIG. 10, curve 121 is the current-voltage characteristic of N-type NDR device 111. The current-voltage curve 121 exhibits N-type negative differential resistance including a high-impedance region 128, a low-impedance region 130 and a negative resistance region 129. Diode 112 exhibits an exponential current-voltage characteristic as shown as curve 122 or curve 123. Curve 122 is the load line of diode 112 during a standby period, and curve 123 is the load line of diode 112 during a read operation. The two stable switching states during the standby period are intersection point 124 and intersection point 126. Intersection point 124 corresponds to a logic state 0, and intersection point 126 corresponds to a logic state 1. During the read operation, the lower state (logic 0) is intersection point 125, and the higher state (logic 1) is not shown in FIG. 10 because the value of the current is close to 1 mA, which is off the scale. To write a logic 1 to the memory cell in FIG. 9A, the voltage across N-type NDR device 111 must exceed a peak voltage, $V_P$, and to write a logic 0 to the memory cell in FIG. 9A, the voltage across N-type NDR device 111 must be less than a threshold voltage, $V_T$.

FIG. 11 presents the current-voltage characteristics shown in FIG. 10 in a logarithmic scale. Referring to FIGS. 9A, 10 and 11, curve 131 is the current-voltage characteristic of N-type NDR device 111, and accordingly, curve 131 is equivalent to curve 121 in FIG. 10. Curve 132 is equivalent to curve 122 in FIG. 10 showing the load line of diode 112 during the standby mode. Curve 133, which is equivalent to curve 123, is the load line of diode 112 during the read operation. The two stable states during the standby period are intersection points 134 and 136, intersecting curve 132 of diode 112 and curve 131 of device 111. Intersection point 134 is equivalent to intersection point 124 in FIG. 10, and intersection point 136 is equivalent to intersection point 126 in FIG. 10. The stable operating points curing the read operation are intersection point 135 and intersection point 137. Intersection point 135 and intersection point 137 intersect curve 133 of diode 112 and curve 131 of N-type NDR device 111. Intersection point 135 is equivalent to intersection point 125. However, intersection point 137 cannot be shown in FIG. 10 because it is out of the scale range of that figure.

Continuing to refer to FIGS. 9A, 10 and 11, when the memory cell of FIG. 9A stores a logic 0, the operating point is at 134 or 124 during the standby period, and during the read operation, the operating point will be moved to intersection point 135 or equivalently to intersection point 125. However, if the memory cell is storing a logic 1, the operating point will be at intersection 136 or 126 during the standby period, and during the read operation, intersection point 137 becomes the operating point.

Referring to FIGS. 9A, 10 and 11, it is noted that the current level of the memory cell of FIG. 9A during the read operation is greater than the current level of the memory cell during the standby period regardless of whether the memory cell is storing a logic 1 or a logic 0. In this instance, when the memory cell of FIG. 9A is storing a logic 1, the current at operating point 137 during the read operation is larger than the current produced at operating point 136 during the standby period. When the memory cell is storing a logic 0, the current at operating point 135 (or 125) during the read operation is larger than the current at operating point 134 (or 124) during the standby period.

Having diode 112 as a load, as shown in FIG. 9A, is advantageous because the differential voltage across the memory cell would be large compared to room-temperature electron energies, and hence the information storage would be more robust and the addressing voltages would be easier to generate. However, the present invention may incorporate any resistive load instead of a load exhibiting an exponential current-voltage characteristic. FIG. 9B illustrates an example. In FIG. 9B, a transistorless memory cell having a first transistorless device being an NDR device 115 and a second transistorless device being a resistor 116 operates in a current-mode according to the present invention. In FIG. 9B, NDR device 115 is coupled to bit line 117 while resistor 116 is coupled to word line 118. However, the positions of NDR device 115 and resistor 116 may be reversed so that NDR device 115 is coupled to word line 118, and resistor 116 is coupled to bit line 117. Because of the lack of a threshold in the current-voltage characteristic of resistor 116, the differential voltage across the memory cell shown in FIG. 9B would be relatively small, and the addressing voltages would be more difficult to generate than those of the memory cell in FIG. 9A. However, the memory cell in FIG. 9B nonetheless can operate as a current-mode transistorless memory cell.

Figure 12:
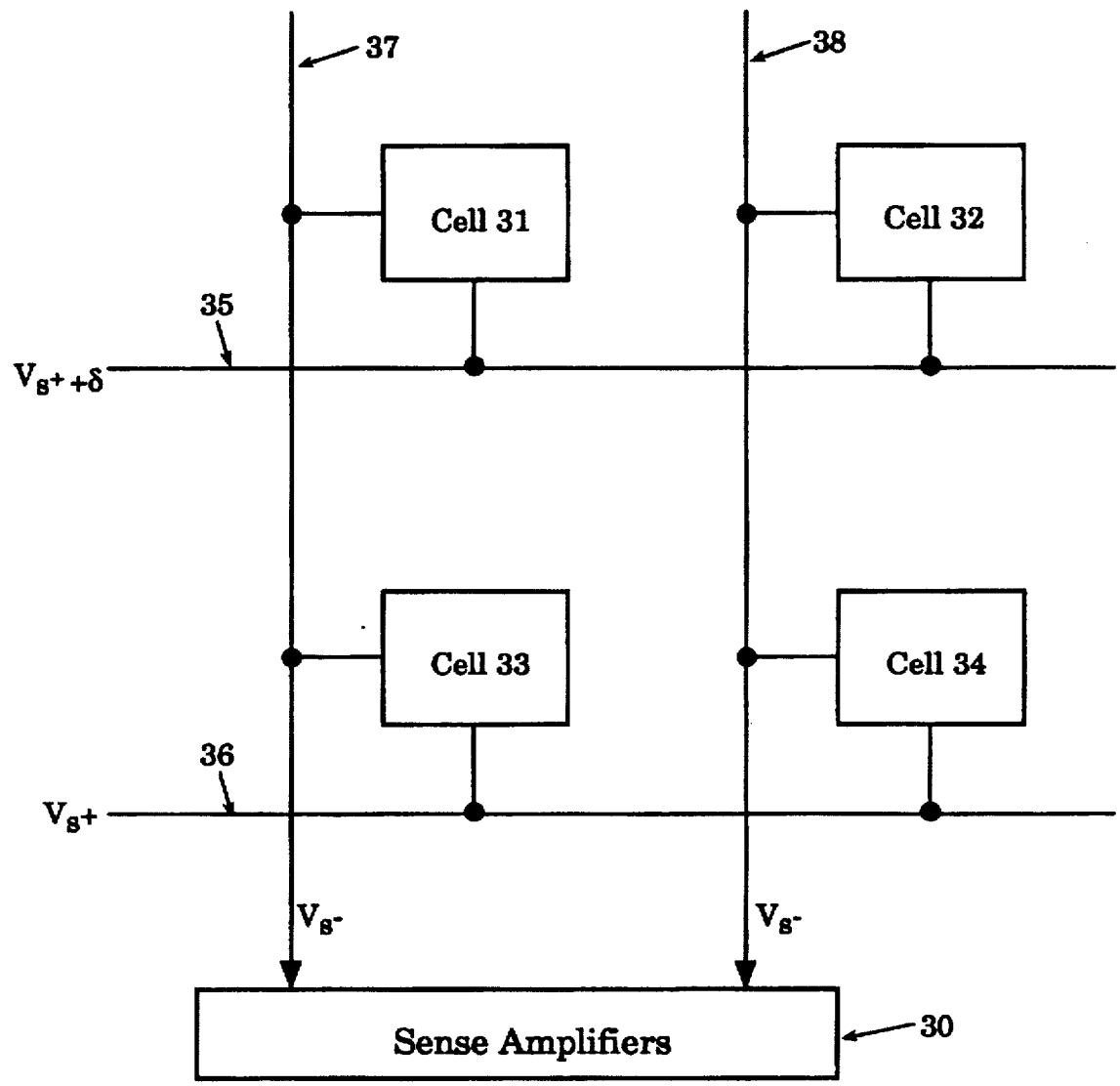
FIG. 12 illustrates a current-mode read operation in accordance with the present invention.
Figure 13A:
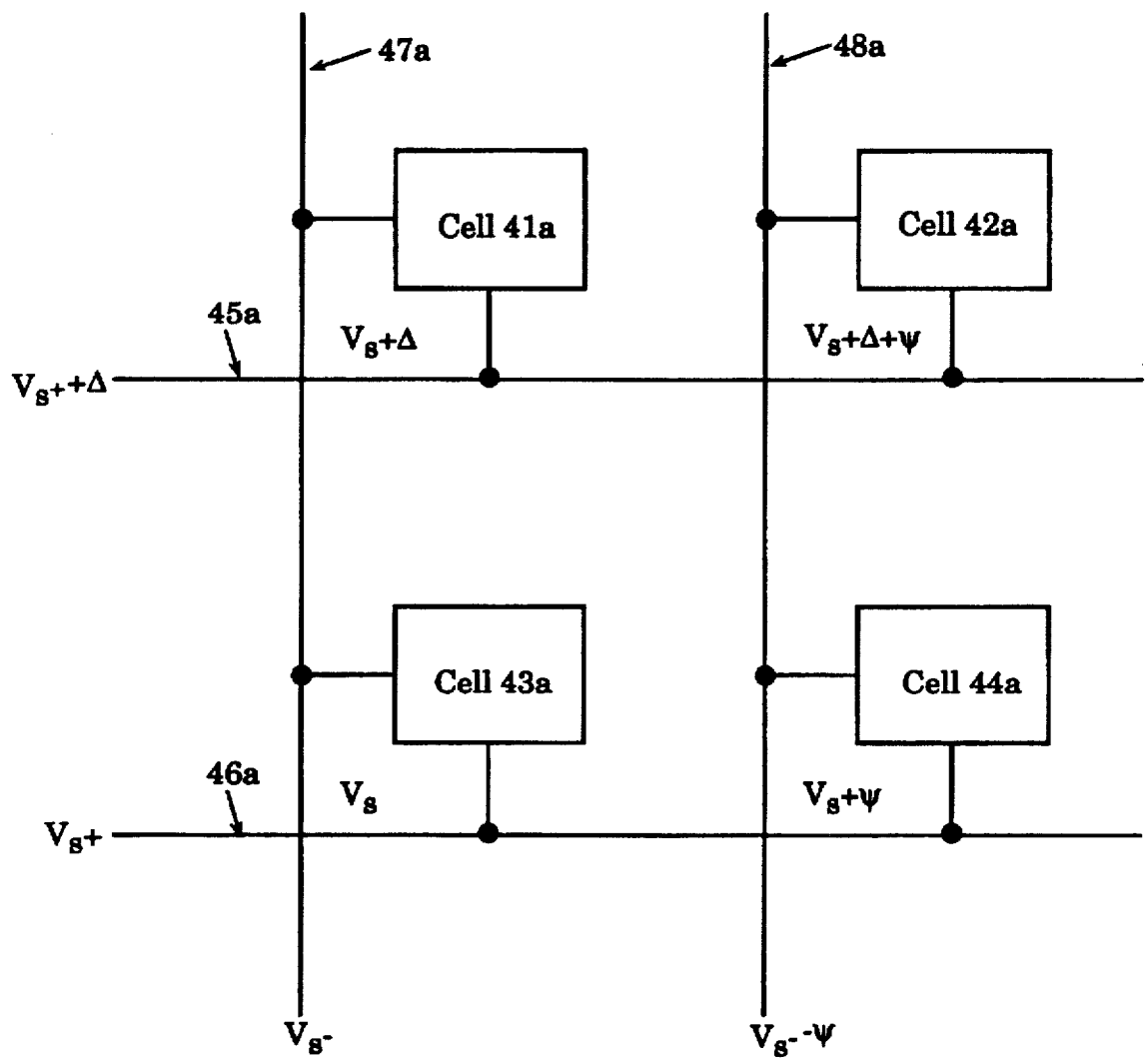
FIG. 13A illustrates a current-mode write operation where a logic 1 is written to a cell in accordance with the present invention.
Figure 13B:
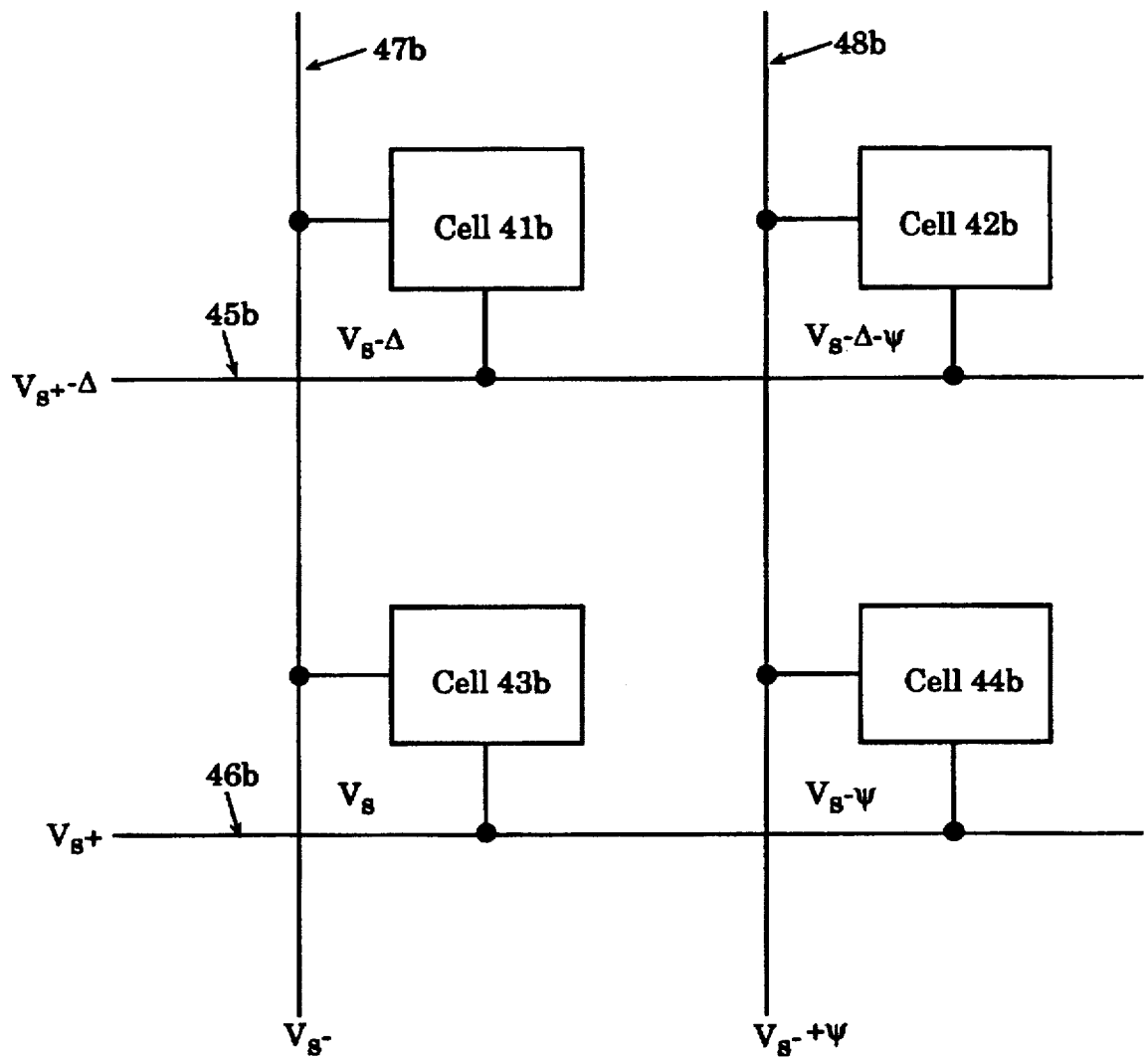
FIG. 13B illustrates a current-mode write operation where a logic 0 is written to a cell in accordance with the present invention.

FIGS. 12, 13A and 13B illustrate current-mode read/write operations in accordance with the present invention. The current-mode read/write operation of the present invention is superior to a voltage-mode read/write operation because the access time can be shortened by not requiring charging and discharging of a memory cell. In addition, although a current-mode read/write scheme has been discussed in other publications, the current-mode method disclosed is distinguishable over other publications because in the present invention, the voltages are applied to the word lines and to the bit lines not only to address a memory cell during a read/write operation, but also to preserve the logic state of the memory cell during standby.

FIG. 12 illustrates a current-mode read operation in accordance with the present invention. For illustration, FIG. 12 shows (i) four individual cells denoted as cell 31, cell 32, cell 33 and cell 34, (ii) two word lines, 35 and 36, (iii) two bit lines, 37 and 38 and (iv) sense amplifiers 30. During a standby period, word line 35 and word line 36 are at a voltage level of $V_{s+}$, bit line 37 and bit line 38 are at a voltage level of $V_{s-}$, and cell 31, cell 32, cell 33 and cell 34 are at a voltage level of $V_s$. To access individual cells, one of the word lines is raised by $\delta$, to $V_{s+}+\delta$. Here, word line 35 is raised to $V_{s+}+\delta$ while word line 36 remains at $V_{s+}$, as shown in FIG. 12. The increase in voltage of word line 35 by $\delta$ causes the voltage across cell 31 and cell 32 to increase by the same amount $\delta$, while the voltage levels across cell 33 and cell 34 remain at the standby voltage level, $V_s$. Thus, cell 31 is at the voltage level of $V_s+\delta$, and cell 32 is at the voltage level of $V_s+\delta$, while cell 33 and cell 34 are at the voltage level of $V_s$.

Continuing to refer to FIG. 12, assume during the standby period, that each cell produces a current I1, I2, I3 and I4 for cell 31, cell 32, cell 33 and cell 34, respectively. In a current-mode read operation according to the present invention, to determine the logic state of a memory cell, sense amplifiers 30 sense current levels of bit lines rather than voltage levels of bit lines. When the voltage of word line 35 is raised from $V_{s+}$ to $V_{s+}+\delta$, each cell that is attached to that particular word line—in this case, cell 31 and cell 32—produces a current that is a sum of its standby current and an additional current due to the voltage increase $\delta$ in word line 35. However, the cells not attached to word line 35 produce their respective standby currents. In this example, cell 31 produces a current that is a sum of I1 and I1 ($\delta$), cell 32 produces a current that is a sum of I2 and I2 (δ), cell 33 produces the standby current, I3, and cell 34 produces the standby current, I4.

Each of sense amplifiers 30 coupled to a corresponding bit line senses the current level of the bit line during the standby period and during the read operation. By sensing the amount of the change in the current levels between the standby mode and the read mode, sense amplifiers 30 determine what logic level each of the cells attached to word line 35 is storing. Thus, during a read operation, sense amplifiers 30 can read the logic levels of all the cells that are attached to word line 35. In this instance, sense amplifiers 30 can read the logic levels of cell 31 and cell 32 by detecting the amount of the change in their respective current levels.

In addition, in a current-mode read operation, the logic values of the memory cells may be read using a "tilt-and-swamp" technique where sense amplifiers 30 read the logic values of the memory cells by sensing the absolute current levels rather than the amount of the change in current levels. The "tilt-and-swamp" scheme consists of: increasing the voltage of a particular word line and sensing one or many bit line currents in parallel. For example, in FIG. 12, when the voltage of word line 35 is raised, if cell 31 is in a logic 1 state, one of sense amplifiers 30 attached to bit line 37 will sense a relatively large current in bit line 37 which swamps out the currents from other cells attached to bit line 37. If, on the other hand, cell 31 is storing a logic 0 state, the sense amplifier attached to bit line 37 will not sense a large current when the voltage of word line 35 is raised. Each of sense amplifiers 30 senses the current level of its corresponding bit line in parallel. Thus, in the "tilt-and-swamp" operation, sense amplifiers can read the logic states of the memory cells by merely sensing the current levels of the bit lines, without comparing the current level of the standby mode with that of the read mode.

FIG. 13A illustrates a current-mode write operation in accordance with the present invention. Again, although a memory typically consists of a large number (>1 million) of cells, for illustration, FIG. 13A shows four cells, cell 41a, cell 42a, cell 43a and cell 44a, two word lines, 45a and 46a, and two bit lines, 47a and 48b. In a current-mode write operation according to the present invention, to write a logic 1 or 0 to a memory cell, a current level instead of a voltage level that corresponds to a logic 1 or a logic 0 is written to the memory cell. In this current-mode write operation, the individual cells During a standby period, each of the word lines is at the voltage level of $V_s+$, each of the bit lines is at the voltage level of $V_s-$, and each of the cells is at the voltage level of $V_s$.

Continuing to refer to FIG. 13A, during a write operation, to write a logic 1 to a cell, one of the word lines is raised to $V_{s+}+\Delta$, and one of the bit lines is lowered to $V_{s-}-\Psi$. Here, word line 45a is raised to $V_{s+}+\Delta$, and bit line 48a is lowered to $V_{s-}-\Psi$. The changes in voltage cause the voltage across cell 41a to rise to $V_s+\Delta$, the voltage across cell 42a to rise to $V_s+\Delta+\Psi$, the voltage across cell 44a to rise to $V_s+\Psi$ while the voltage across cell 43a remains at the standby voltage level of $V_s$. The amount of the voltage change, Δ or Ψ, is selected so that while $V_s+\Delta$ or $V_s+\Psi$ is less than a peak voltage, $V_P$, $V_s+\Delta+\Psi$ is greater than $V_P$. When the voltage across a cell is greater than $V_P$, a logic 1 is written to the cell. Thus, while the logic state of a cell having the voltage level of $V_s$, $V_s+\Delta$ or $V_s+\Psi$ remains at its previous logic state, the logic state of a cell having the voltage level of $V_s+\Delta+\Psi$ becomes (or remains) logic 1.

Accordingly, in this instance, a logic 1 is written to cell 42a, while cell 41a, cell 43a and cell 44a remain at their previous states. The present invention uses a current-mode method instead of a voltage-mode method because the read/write operation can be accomplished at a much faster speed using a current-mode method than a voltage-mode method. A logic in a memory cell is read by reading the current level of the memory cell during a current-mode read operation, and a logic is written to a memory cell by writing a current level to the memory cell.

FIG. 13B illustrates a current-mode write operation in accordance with the present invention, wherein a logic 0 is written to a cell. For illustration, four cells (cell 41b, cell 42b, cell 43b, and cell 44b), two word lines (45b and 46b), and two bit lines (47b and 48b) are shown in FIG. 13B. During a standby period, each of the word lines is at the voltage level of $V_s+$, each of the bit lines is at the voltage level of $V_s-$, and each of the cells is at the voltage level of $V_s$.

Continuing to refer to FIG. 13B, to write a logic 0 to a cell, one of the word lines is lowered to $V_{s+}-\Delta$, and one of the bit lines is raised to $V_{s-}+\Psi$. Here, word line 45b is lowered to $V_{s+}-\Delta$, and bit line 48b is raised to $V_{s-}+\Psi$. The changes in voltage cause the voltage across cell 41b to drop to $V_s-\Delta$, the voltage across cell 42b to drop to $V_s-\Delta-\Psi$, and the voltage across cell 44b to drop to $V_s-\Psi$, while the voltage across cell 43b remains at the standby voltage level of $V_s$. The amount of the voltage change, Δ or Ψ, is selected so that while $V_s-\Delta$ or $V_s-\Psi$ is greater than a threshold voltage, $V_T$, $V_s-\Delta-\Psi$ is less than $V_T$. When the voltage across a cell is less than $V_T$, a logic 0 is written to the cell. Thus, while the logic state of a cell having the voltage level of $V_s$, $V_s-\Delta$ or $V_s-\Psi$ remains at its previous logic state, the logic state of a cell having the voltage level of $V_s-\Delta-\Psi$ becomes (or remains) logic 0. Accordingly, in this instance, a logic 0 is written to cell 42b, while cell 41b, cell 43b and cell 44b remain at their respective previous states.

Figure 14:
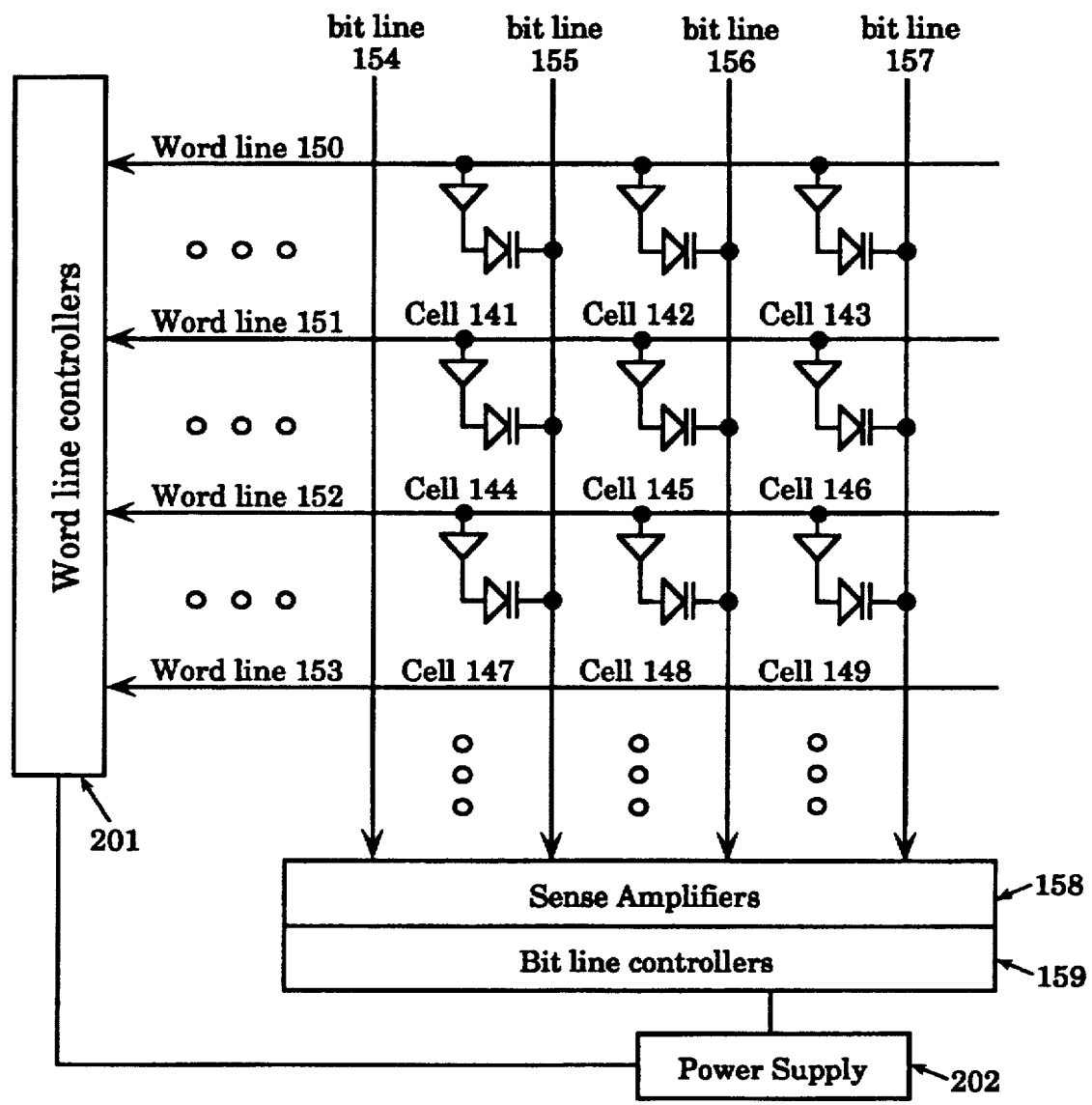
FIG. 14 presents a memory system with transistorless memory cells in accordance with the present invention.

FIG. 14 presents a memory system incorporating the memory cell of FIG. 9A in accordance with the present invention. The memory system consists of a plurality of memory cells (i.e., $10^6$–$10^{11}$ cells/cm$^2$) denoted as cell 141, cell 142, cell 143, etc., a plurality of word lines, a plurality of bit lines, word line controllers 201, sense amplifiers 158, bit line controllers 159 and a power supply 202. Each memory cell is coupled to a word line and to a bit line. Each word line is coupled to a word line controller 201, and each bit line is coupled to a sense amplifier 158 and to a bit line controller 159. Word line controllers 201, sense amplifiers 158 and bit line controllers 159 are coupled to power supply 201.

Continuing to refer to FIG. 14, word line controllers 158 control the word lines by raising and lowering the voltages of the word lines. Bit line controllers 159 control the bit lines by raising and lowering the voltages of the bit lines. For example, during a standby period, the word line controllers and the bit line controllers would transmit appropriate voltage signals to the word lines and to the bit lines respectively to provide a voltage signal of about 1 V across each memory cell so that each memory cell can preserve its logic state. During a read mode, a selected word line controller would transmit a voltage that is higher than the standby voltage to the corresponding word line, so that the sense amplifiers can detect the logic states of the memory cells that are connected to the particular word line. To write a logic 1 to a selected memory cell, the corresponding word line controller raises the voltage of the associated word line, and the corresponding bit line controller lowers the voltage of the associated bit line so that the voltage across the selected memory cell would be higher than a peak voltage, $V_P'$. To write a logic 0 to a selected memory cell, the corresponding word line controller lowers the voltage of the associated word line, and the corresponding bit line controller raises the voltage of the associated bit line so that the voltage across the selected memory cell would be lower than a threshold voltage, $V_T'$.

Continuing to refer to FIG. 14, by sensing the change in currents generated in each of the bit lines between the standby mode and the read mode, sense amplifiers 158 determine whether a memory cell is storing a logic state 1 or a logic state 0. While power supply 202 is on, each memory cell generates a current continuously. To discriminate noise, a sense amplifier requires an input voltage of at least 3 KT/q, which is about 0.08 V at room temperature. To satisfy this input voltage requirement, each bit line produces at least $10^6$ electrons. The memory system can be designed to meet various system requirements including but not limited to (i) the access time to write a cell being less than ten times the access time to read the cell, (ii) the capacitance value of a cell being less than 25 fF, and (iii) the total current of the memory system not exceeding 1 Amp. It should be noted that these system requirements are mere examples of what a memory system of the present invention can accomplish, and are not limitations upon the present invention.

FIG. 15 illustrates the speed and density estimation of a transistorless memory system in accordance with the present invention. This chart shows the kind of high density and high speed the present invention can achieve when a memory system requires a total maximum current of 1 Amp/cm² and a minimum of $10^6$ electrons for each memory cell. For a given maximum transient current density of $10^5$ Amp/cm², an address current-to-static current ratio of 20,000 and an access time of 1 nsec, the memory system can achieve a memory density of 123 MB/cm² at a current level of 200 µA for each cell. When the access time changes from 1 nsec to 10 nsec, the current level of each cell decreases from 200 µA to 20 µA to keep the product of the current level of each memory cell and the access time constant (i.e., at $10^6$ electrons), and the memory density increases from 123 MB/cm² to 1 GB/cm² to maintain the amount of total static current—the product of the current level of each cell and the memory density—constant. As the access time increases from 10 nsec to 100 nsec, the memory density increases from 1 GB/cm² to 15 GB/cm². Thus, in this example, the larger the access time becomes, the higher the memory density one can achieve. In addition, if the access time is fixed at 1 nsec and the cell current is fixed at 200 µA, but if the maximum transient current density changes from $10^3$ to $10^5$ Amp/cm², then the memory density changes from 1 MB/cm² to 123 MB/cm². Thus, the memory density increases as the maximum transient current density increases for a given access time. It should be noted that this chart merely shows some examples of achievable memory densities and access times, but there are numerous other combinations of speed and density goals that the present invention can realize.

Figure 16A:
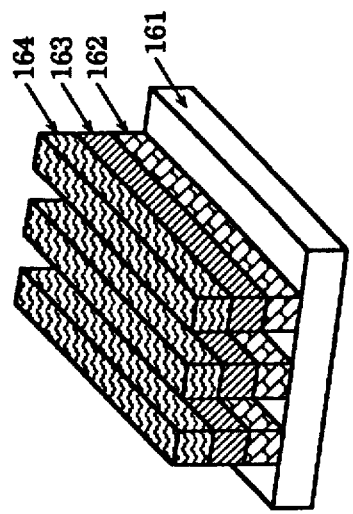
FIG. 16A illustrates the first processing step of fabricating self-aligned memory cells: formation of an insulating layer, a lower conducting layer, a switch diode layer and a load layer in accordance with the present invention.

With reference to FIGS. 16A–16D, the figures illustrate a process technique for fabricating self-aligned memory cells. In FIG. 16A, the process begins with a layer 161 which can be either an insulating substrate or an insulating layer on a non-insulating substrate. Next, a lower conducting layer 162 is formed over insulating layer 161. A switch diode layer 163 exhibiting negative differential resistance is formed over lower conducting layer 162. Then a load layer 164 is formed above switch diode layer 163. Load layer 164 may be a load device such as diode 112 in FIG. 9A, exhibiting an exponential current-voltage characteristic as shown in FIG. 10 or resistor 116 in FIG. 9B having a linear current-voltage characteristic. It should be noted that load layer 164 may be formed prior to forming switch diode layer 163 in which case switch diode layer 163 is formed above load layer 164.

Switch diode layer 163 may be composed of, but is not limited to, (1) homojunction devices each including at least one P-type semiconducting region of one semiconductor and at least one N-type semiconducting region of the same semiconductor, (2) heterojunction devices each including at least one P-type semiconducting region of one semiconductor and at least one N-type semiconducting region of another semiconductor, or (3) Schottky diodes each including a semiconductor region and a metal region.

If load layer 164 is a diode, load layer 164 also may be composed of, but is not limited to, (1) homojunction devices each including at least one P-type semiconducting region of one semiconductor and at least one N-type semiconducting region of the same semiconductor, (2) heterojunction devices each including at least one P-type semiconducting region of one semiconductor and at least one N-type semiconducting region of another semiconductor, or (3) Schottky diodes each including a semiconductor region and a metal region. If, on the other hand, load layer 164 is a resistor, it may include, but is not limited to, a P-type semiconducting region, an N-type semiconducting region or any deposited material.

Figure 16B:
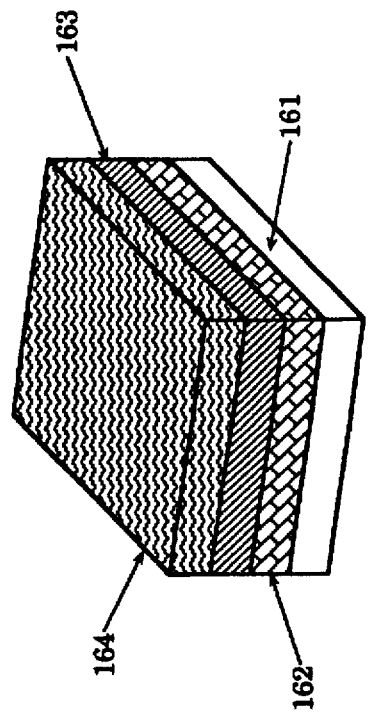
FIG. 16B illustrates the second processing step of fabricating self-aligned memory cells: etching of the load layer, the switch diode layer and the lower conducting layer in accordance with the present invention.

FIG. 16B illustrates patterning and etching of the various layers. Load layer 164 is patterned using a lithographic process. In a lithographic process, a layer of photoresist (not shown) is coated over load layer 164. To pattern the photoresist layer, one may use optical, electron beam, ion beam, X-ray or other lithography. Once the photoresist layer is patterned, load layer 164 is etched using a wet etch or a dry etch. Dry etch techniques may include but are not limited to sputter etching, ion beam milling, plasma etching, reactive ion etching, or reactive ion beam etching. Next, the photoresist layer may be stripped, or it may be left on load layer 164 to be used as an additional mask layer to protect load layer 164 during the subsequent etching process. Switch diode layer 163 is etched using as a mask load layer 164 and the photoresist layer if it is not stripped. Either a wet etch or a dry etch may be used. Lower conducting layer 162 is also etched using as a mask load layer 164, switch diode layer 163 and the photoresist layer.

When the layers are etched sequentially as described above, etching methods need to be carefully selected so that an etching process for one layer is compatible with other layers. An optimum etchant is one that can selectively etch one layer and not the other layers, to minimize undercutting of the layers. On the other hand, one may be able to etch all three layers 164, 163 and 162 with one etch process. In that instance, all three layers will be etched simultaneously rather than sequentially.

Upon completion of the etch process, lower conducting layer 162 and switch diode layer 163 are self-aligned to load layer 164. The name self-aligned fabrication comes from this type of process where multi-layers can be etched using one lithography step. Here, only one lithography step is required prior to etching load layer 164. No additional lithography steps are required for switch diode layer 163 or lower conducting layer 162. Thus, self-aligned fabrication makes processing much simpler and less expensive.

Figure 16C:
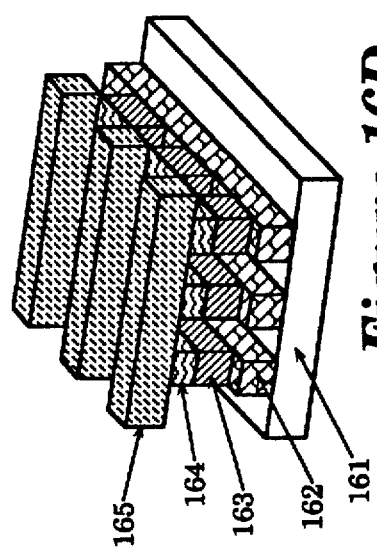
FIG. 16C illustrates the third processing step of fabricating self-aligned memory cells: forming, patterning and etching of an upper conducting layer in accordance with the present invention.

FIG. 16C illustrates an upper conducting layer 165 formed over load layer 164. Before forming upper conducting layer 165, the etched-out regions of load layer 164, switch diode layer 163 and lower conducting layer 162 need to be filled. There are many methods to planarize load layer 164. One may be to spin coat photoresist to fill the gaps. Another may be to deposit an insulating material and to etch back the insulating material so that load layer 164 would be planar. After making load layer 164 planar using the gap filling material, the upper conducting layer 165 is formed over load layer 164. Upper conducting layer 165 is patterned and etched using similar techniques as described above with respect to FIG. 16B. If photoresist is used as a gap filler, it may be removed after etching upper conducting layer 165, leaving upper conducting layer 165 in an air-bridge structure.

Figure 16D:
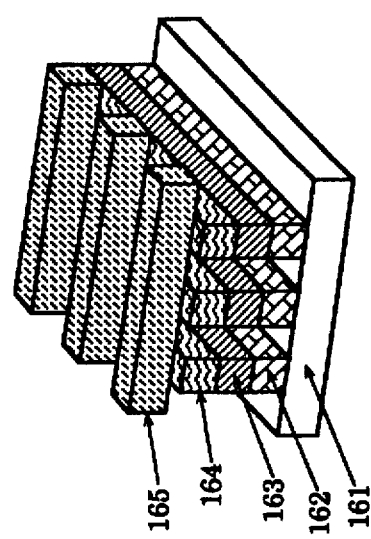
FIG. 16D illustrates the final processing step of fabricating self-aligned memory cells: etching of the load layer and the switch diode layer in accordance with the present invention.

Finally, in FIG. 16D, using upper conducting layer 165 as a mask, load layer 164 and switch diode layer 163 are etched without an additional lithography step, forming three-dimensional cubic memory cells, each cell consisting of a switch diode and a load device.

Either of each of the conducting rows on upper conducting layer 165 or each of the conducting columns of lower conducting layer 162 may be a word line or a bit line of a memory. If upper conducting layer 165 is used for word lines, then lower conducting layer 162 is used for bit lines. Conversely, if upper conducting layer 165 is used for bit lines, then lower conducting layer 162 is used for word lines.

Even though FIGS. 9A and 9B show that a load device is coupled to a word line, and a switch diode is coupled to a bit line, either of a load device or a switch diode can be connected to a word line or a bit line, as discussed earlier. Thus, if a load device is connected to a word line, then a switch diode is connected to a bit line as in FIGS. 9A and 9B. If, on the other hand, a load device is connected to a bit line, then a switch diode is connected to a word line. A word line of upper conducting layer 165 is parallel to the other word lines, and a bit line of lower conducting layer 162 is parallel to the other bit lines of lower conducting layer 162.

The three-dimensional, high density memory layers formed in FIGS. 16A–16D can be fabricated from many different types of processing methods including but not limited to molecular beam epitaxy and chemical vapor deposition processes. The devices shown in FIGS. 9A and 9B can be also manufactured by conventional diffusion and ion implantation processes, although in the conventional process technology, one may not be able to achieve the kind of high density packaging that is otherwise achievable in the present invention.

Switch diode layer 163 and load layer 164 in FIGS. 16A–16D may be formed using any one or any combination of the elements from the group consisting of aluminum, gallium, arsenic, boron, phosphorus, silicon, germanium, antimony, indium and beryllium.

While the present invention has been particularly described with reference to FIGS. 1 through 16D, it should be understood that the figures are for illustration only and should not be taken as limitations upon the invention. It is further contemplated that many changes and modifications may be made to the invention, by one of ordinary skill in the art, without departing from the spirit and scope of the invention as disclosed herein.

We claim:

1. A self-aligned, three-dimensional computer memory structure comprising:

a plurality of first conducting regions arranged in C columns, each of the first conducting regions having a plurality of sides;

a first array having a plurality of first semiconducting regions arranged in R rows and C columns, each of the first semiconductor regions having a plurality of sides, a first side of each of the first semiconducting regions in a column coupled to a first side of the first conducting region in the corresponding column;

a second array having a plurality of second semiconducting regions arranged in R rows and C columns, each of the second semiconducting regions having a plurality of sides, a first side of each of the second semiconducting regions coupled to a second side of a corresponding one of the first semiconducting regions; and a plurality of second conducting regions arranged in R rows, each of the second conducting regions having a plurality of sides, a second side of each of the second semiconducting regions in a row coupled to a first side of the second conducting region in the corresponding row;

wherein a second side and a third side of the first conducting region in each column are aligned to a third side and a fourth side of each of the first semiconducting regions in the corresponding column, respectively; the third side and the fourth side of each of the first semiconducting regions are aligned to a third side and a fourth side of a corresponding one of the second semiconducting regions, respectively; a fifth side and a sixth side of each of the first semiconducting regions are aligned to a fifth side and a sixth side of a corresponding one of the second semiconducting region, respectively; and the fifth side and the sixth side of each of the second semiconducting regions in a row are aligned to a second side and a third side of the second conducting region in the corresponding row, respectively;

wherein the first semiconducting regions and the second semiconducting regions are transistorless devices and each of the first semiconducting regions comprises either of a switch diode or a load device.

2. The computer memory structure of claim 1 wherein isolation regions exist between the first conducting regions, isolation regions exist between the first semiconducting regions, isolation regions exist between the second semiconducting regions, and isolation regions exist between the second conducting regions.

3. The computer memory structure of claim 2 wherein the isolation regions between the first conducting regions, the isolation regions between the first semiconducting regions, the isolation regions between the second semiconducting regions and the isolation regions between the second conducting regions are filled with air.

4. The computer memory structure of claim 2 wherein the isolation regions between the first conducting regions, the isolation regions between the first semiconducting regions, the isolation regions between the second semiconducting regions and the isolation regions between the second conducting regions are filled with solid insulating materials.

5. The computer memory structure of claim 4 wherein each of the second semiconducting regions comprises either of a load device or a switch diode wherein the first semiconducting regions and the second semiconducting regions are different so that when each of the first semiconducting regions is one of the switch diodes, each of the second semiconducting regions is one of the load devices, and when each of the first semiconducting regions is one of the load devices, each of the second semiconducting regions is one of the switch diodes.

6. The computer memory structure of claim 5 wherein each of the switch diodes exhibits negative differential resistance.

7. The computer memory structure of claim 6 wherein each of the load devices exhibits either of an exponential current-voltage characteristic and a linear current-voltage characteristic.

8. The computer memory structure of claim 7 wherein each of the switch diodes exhibits negative differential resistance including a high-impedance region, a low-impedance region and a negative-resistance region, the negative differential resistance being characterized by a voltage-current relationship having multiple values of current for the same value of voltage.

9. The computer memory structure of claim 1 wherein each of the first conducting regions comprises either of a bit line and a word line, and each of the second conducting regions comprises either of a word line or a bit line wherein the first conducting regions and the second conducting regions are different so that when the first conducting regions include the word lines, the second conducting regions include the bit lines, and when the first conducting regions include the bit lines, the second conducting regions include the word lines.

* * * * *

UNITED STATES PATENT AND TRADEMARK OFFICE
CERTIFICATE OF CORRECTION

PATENT NO. : 5,745,407  
DATED : April 28, 1998  
INVENTOR(S) : Levy et al.

Page 1 of 1

It is certified that error appears in the above-identified patent and that said Letters Patent is hereby corrected as shown below:

Column 14,
Line 54, delete "claim 4" and insert -- claim 1 --.

Signed and Sealed this

Twenty-eighth Day of May, 2002

Attest:

Attesting Officer

JAMES E. ROGAN
Director of the United States Patent and Trademark Office